(12) United States Patent
Sato (10) Patent No.: US 11,650,915 B2
(45) Date of Patent: May 16, 2023

(54) TEMPERATURE-BASED DATA STORAGE PROCESSING

(71) Applicant: Micron Technology, Inc., Boise, ID (US)

(72) Inventor: Junichi Sato, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 17/489,471

(22) Filed: Sep. 29, 2021

(65) Prior Publication Data

US 2022/0019527 A1 Jan. 20, 2022

Related U.S. Application Data

(63) Continuation of application No. 16/783,012, filed on Feb. 5, 2020, now Pat. No. 11,144,452.

(51) Int. Cl.
*G06F 12/00* (2006.01)
*G06F 12/02* (2006.01)
(Continued)

(52) U.S. Cl.
CPC .......... *G06F 12/0246* (2013.01); *F24F 11/30* (2018.01); *G06F 1/206* (2013.01);
(Continued)

(58) Field of Classification Search
CPC .... G06F 1/206; G06F 11/3058; G06F 3/0653; G06F 1/3225; G06F 1/3275; G06F 11/3034; G06F 3/061; G06F 12/06; G06F 11/3476; G06F 12/023; G06F 2212/1028; G06F 2212/2532; G06F 3/0673; G06F 3/0659; G06F 1/3221; G06F 1/3268; G06F 11/34; G06F 11/3414; G06F 12/0246; G06F 13/18; G06F 2201/835; G06F 3/0604; G06F 3/0656; G06F 3/0683; G06F 9/46; G06F 3/0679; G06F 1/1692; G06F 1/20;
(Continued)

(56) References Cited

U.S. PATENT DOCUMENTS 9,547,588 B1 1/2017 Biederman et al.
10,289,185 B2 * 5/2019 Ghose .................. H04L 9/40
(Continued)

OTHER PUBLICATIONS

International Search Report and Written Opinion, PCT/US2020/019001, dated Jun. 15, 2020.
(Continued)

*Primary Examiner* — Thong Q Le
(74) *Attorney, Agent, or Firm* — Greenberg Traurig (57) ABSTRACT

A data storage device monitors a storage media temperature and adjusts data storage operations of the storage device based on the monitored and/or a predicted future temperature of the storage media. In one approach, data is stored in a first mode (e.g., a TLC mode) in a non-volatile storage media. One or more temperatures associated with the non-volatile storage media are monitored using at least one sensor to collect sensor data. The manner of storage of the data in the storage device is adjusted based on the collected sensor data. The adjusting comprises compressing the data to provide compressed data, and storing the compressed data in a second mode (e.g., an SLC mode) in the non-volatile storage media.

20 Claims, 3 Drawing Sheets

(51) Int. Cl.
    *G06F 11/30*     (2006.01)
    *H04L 67/12*     (2022.01)
    *G11C 11/56*     (2006.01)
    *G06F 1/20*     (2006.01)
    *F24F 11/30*     (2018.01)
    *F24F 110/10*     (2018.01)

(52) U.S. Cl.
CPC ...... *G06F 11/3058* (2013.01); *G11C 11/5628* (2013.01); *H04L 67/12* (2013.01); *F24F 2110/10* (2018.01); *G11C 2211/5641* (2013.01)

(58) Field of Classification Search
CPC ........ G06F 11/327; G06F 3/0638; G06F 1/30; G06F 12/10; G06F 2212/222; G06F 2212/7201; G06F 2212/7203; G06F 2212/7205; G06F 2212/7209; G06F 3/0608; G06F 3/0616; G06F 3/064; G06F 3/0649; G06F 3/0652; G06F 3/0658; G06F 3/0688; G06F 9/5083; G06F 11/3037; G06F 12/0646; G06F 7/461; G06F 7/462; G06F 9/5016; G06F 11/3024; G06F 11/3093; G06F 12/0253; G06F 13/1673; G06F 2212/1036; F24F 11/30; F24F 11/38; F24F 11/46; F24F 2110/10; F24F 2110/12; F24F 11/0001; F24F 2011/0006; F24F 11/52
See application file for complete search history.

(56) References Cited

U.S. PATENT DOCUMENTS

| | | |
|---|---|---|
| 11,144,452 B2 | 10/2021 | Sato |
| 2008/0112221 A1 | 5/2008 | Park et al. |
| 2010/0169547 A1 | 7/2010 | Ou |
| 2011/0107049 A1 | 5/2011 | Kwon et al. |
| 2011/0199823 A1 | 8/2011 | Bar-Or et al. |
| 2012/0224425 A1 | 9/2012 | Fai et al. |
| 2013/0145085 A1 | 6/2013 | Yu et al. |
| 2013/0326313 A1 | 12/2013 | Khan |
| 2014/0250257 A1 | 9/2014 | Khan et al. |
| 2014/0281167 A1 | 9/2014 | Danilak et al. |
| 2014/0281170 A1 | 9/2014 | Cho et al. |
| 2014/0340246 A1 | 11/2014 | Wu |
| 2015/0092488 A1 | 4/2015 | Wakchaure et al. |
| 2015/0143026 A1 | 5/2015 | Reddy et al. |
| 2016/0125059 A1 | 5/2016 | Jain et al. |
| 2016/0268000 A1 | 9/2016 | Thompson et al. |
| 2016/0371190 A1 | 12/2016 | Romanovskiy |
| 2017/0017281 A1 | 1/2017 | Artman et al. |
| 2017/0153814 A1 | 6/2017 | Ryu et al. |
| 2017/0206979 A1 | 7/2017 | Cohen et al. |
| 2018/0039537 A1 | 2/2018 | Chih et al. |
| 2019/0050153 A1 | 2/2019 | Yang et al. |
| 2019/0095321 A1 | 3/2019 | Lin et al. |
| 2020/0042223 A1 | 2/2020 | Li |
| 2020/0272363 A1 | 8/2020 | Sato |
| 2020/0293439 A1 | 9/2020 | Kodama |
| 2021/0240381 A1 | 8/2021 | Sato |
| 2021/0240607 A1 | 8/2021 | Sato |

OTHER PUBLICATIONS

International Search Report and Written Opinion, PCT/US2021/015266, dated Apr. 22, 2021.
International Search Report and Written Opinion, PCT/US2021/015265, dated May 13, 2021.
Parnell, Thomas, "NAND Flash Basics & Error Characteristics: Why Do We Need Smart Controllers." Flash Memory Summit 2016, retrieved from the Internet on Jan. 16, 2021 <URL: https://www.flashmemorysummit.com/English/Collaterals/Proceedings/2016/20160808_PreConfH_Parnell.pdf>, 2016.
Controlling Firmware Storage Density Based on Temperature Detection, U.S. Appl. No. 16/783,016, filed Feb. 5, 2020, Junichi Sato, Notice of Allowance Mailed—Application Received in Office of Publications, dated Apr. 7, 2021.
Temperature-Based Data Storage Processing, U.S. Appl. No. 16/783,012, filed Feb. 5, 2020, Junichi Sato, Patented Case, Feb. 16, 2021.
Controlling Firmware Storage Density Based on Temperature Detection, U.S. Appl. No. 17/566,508, filed Dec. 30, 2021, Junichi Sato, Docketed New Case—Ready for Examination, Jan. 12, 2022.

* cited by examiner

TEMPERATURE-BASED DATA STORAGE PROCESSING

RELATED APPLICATIONS

The present application is a continuation application of U.S. patent application Ser. No. 16/783,012 filed Feb. 5, 2020, issued as U.S. Pat. No. 11,144,452 on Oct. 12, 2021, the entire disclosure of which application is hereby incorporated herein by reference.

The present application is related to U.S. Non-Provisional application Ser. No. 16/281,740 filed Feb. 21, 2019, entitled "REFLOW ENDURANCE IMPROVEMENTS IN TRIPLE-LEVEL CELL NAND FLASH," by Junichi Sato, the entire contents of which application is incorporated by reference as if fully set forth herein.

FIELD OF THE TECHNOLOGY

At least some embodiments disclosed herein relate to semiconductor memory and methods in general, and more particularly, but not limited to improvements for memory data storage processing based on temperature.

BACKGROUND

Various types of non-volatile storage devices can be used to store data. Non-volatile storage devices can include NAND flash memory devices. NAND Flash is a type of flash memory constructed using NAND logic gates. Alternatively, NOR flash is a type of flash memory constructed using NOR logic gates. Currently, the use of NAND flash predominates the flash market.

Typical computer storage devices have controllers that receive data access requests from host computers and perform programmed computing tasks to implement the requests in ways that may be specific to the media and structure configured in the storage devices. In one example, a flash memory controller manages data stored in flash memory and communicates with a computer device. In some cases, flash memory controllers are used in solid state drives for use in mobile devices, or in SD cards or similar media for use in digital cameras.

Firmware can be used to operate a flash memory controller for a particular storage device. In one example, when a computer system or device reads data from or writes data to a flash memory device, it communicates with the flash memory controller.

Typically, a flash memory controller includes a flash translation layer (FTL) that maps logical block addresses (LBAs) received from a host device to physical addresses of flash memory. By doing so, the FTL provides a logical-to-physical mapping.

In typical flash memories, NAND or NOR transistors are used to store information and are arranged in arrays or grids of gates accessible via bit and word lines, the intersection of which is referred to as a cell. The simplest flash memories store one bit of information per cell and are referred to as single-level cell (SLC) flash memories. In a multi-level cell (MLC) flash, a cell stores more than one bit of information. Specifically, traditionally MLC flash has stored two bits of information per cell. Correspondingly, triple-level cell (TLC) flash stores three bits of information per cell, and a quad-level cell (QLC) flash stores four bits of information per cell.

The principle tradeoffs between SLC and MLC, TLC, or QLC flash are cost and speed. SLC flash, storing one bit per cell, has the fastest access times, but also costs significantly more than MLC, TLC, or QLC flash. Conversely, QLC flash has the slowest access, but has the lowest cost. MLC and TLC flash fall between SLC flash and QLC flash, wherein MLC flash is faster and more expensive than TLC flash, and TLC flash is faster and more expensive than QLC flash. Both, however, are slower and cheaper than SLC flash. Additionally, MLC, TLC, and QLC flash has lower endurance than SLC flash and suffers from higher error rates and heat sensitivity.

A hybrid type of flash is referred to as pseudo SLC (pSLC). In a pSLC flash device, a physical MLC or TLC flash array is operated in an SLC mode. That is, despite having multiple transistors per cell, the MLC/TLC flash array only utilizes one of these cells, effectively acting as an SLC device. pSLC Flash is sometimes referred to as enhanced MLC (eMLC), iSLC, super MLC, MLC+, turbo MLC, or by other names.

BRIEF DESCRIPTION OF THE DRAWINGS

The embodiments are illustrated by way of example and not limitation in the figures of the accompanying drawings in which like references indicate similar elements.

DETAILED DESCRIPTION

The following disclosure describes various embodiments for improving the operation of flash memories. At least some embodiments herein relate to managing data storage in a flash memory storage device based on monitoring one or more temperatures associated with operation of the storage device (e.g., monitoring an internal storage media temperature). The storage device may, for example, store data used by a host device (e.g., a computing device of an autonomous vehicle, or another computing device that accesses data stored in the storage device). In one example, the storage device is a solid-state drive mounted in an electric vehicle.

In prior flash memories, the heat generated during operation of a storage device and/or the elevated operating temperature of an environment in which the storage device operates causes a technical problem. In particular, data stored in the storage device can be lost due to exposure of a data storage media of the storage device to excessive temperatures. This data loss significantly degrades performance of the storage device by reducing the reliability of the stored data.

In one example, data can be lost from some of the memory cells of the storage media due to failure caused by elevated temperature. In one example, demands on a controller of the storage device for error correction or other failure processing (e.g., running of diagnostics) is significantly increased. In one example, responsiveness of the storage device to a host device is degraded as the storage device needs to handle an increased number and/or rate of data storage failure events.

Various embodiments of the present disclosure provide a technological solution to one or more of the above technical problems. In one embodiment, in order to avoid data loss, a data storage device monitors the storage media temperature and adjusts data storage operations of the storage device based on the monitored and/or a predicted future temperature of the storage media.

In one example, when the storage media temperature is increasing (e.g., the temperature is detected to exceed a predetermined threshold), data stored in a TLC mode can be re-saved in a compressed, SLC mode to trade performance for reliability. When the media temperature returns to a suitable range (e.g., the media temperature is determined to have fallen below the predetermined threshold, or below a different threshold), the data can be decompressed and stored in, for example, TLC or QLC mode for improved storage capacity (data can be stored in a TLC or QLC mode at a higher density than when stored in an SLC mode).

In one embodiment, a cooling or ventilation system (e.g., an HVAC system) of a vehicle can be activated automatically to prevent the memory media from reaching extreme temperatures. In one example, the cooling system is activated based on a signal from a controller of the storage device. The signal is generated when the controller determines that the storage media temperature has, or will in the future, exceed a fixed temperature limit.

In one example, a temperature sensor is coupled to send sensor data to the controller. The controller evaluates the sensor data to determine the temperature and/or predict a future temperature.

In one embodiment, the controller uses a machine learning model to predict the temperature. In one example, the model is an artificial neural network. In one example, the machine learning model uses input data including the sensor data from a sensor in the storage device and/or sensor data from a sensor external to the storage device.

In one embodiment, a method for a storage device comprises: storing, by a controller of the storage device, first data in a first mode (e.g., a TLC mode) in a non-volatile storage media; monitoring at least one temperature associated with the non-volatile storage media; and adjusting, based on monitoring the at least one temperature, a manner of storage of the first data. Adjusting the manner of storage comprises: compressing the first data to provide compressed data, and storing the compressed data in a second mode (e.g., an SLC mode) in the non-volatile storage media. The first mode has a storage density greater than the second mode.

In one example, the non-volatile storage media includes both TLC and SLC flash arrays. In one example, the non-volatile storage media uses only triple-level cell flash, but includes at least a region of a flash array that is pseudo SLC (e.g., a portion of a TLC flash array is operated in an SLC mode).

Figure 1:
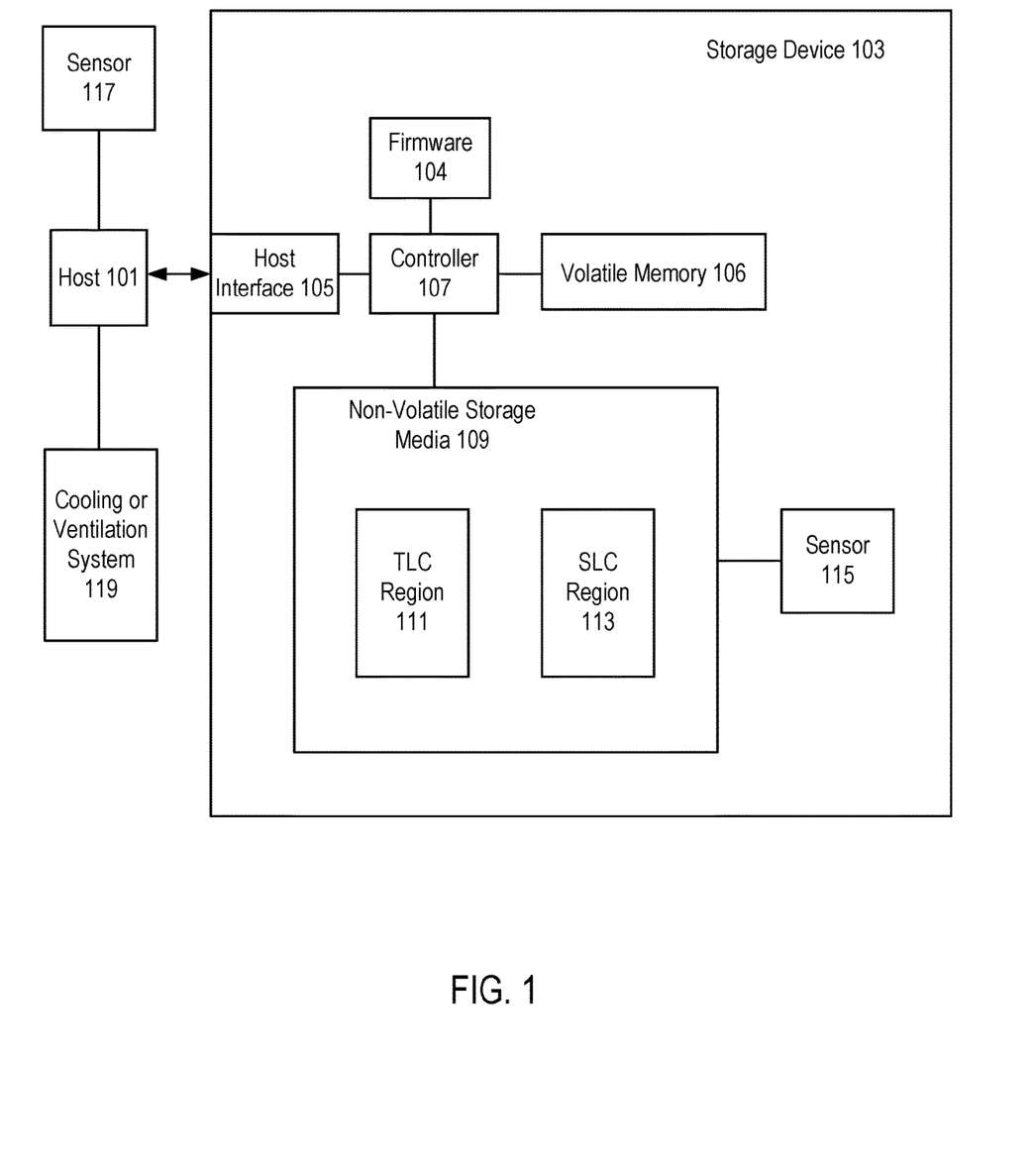
FIG. 1 illustrates a storage device including a sensor to monitor a temperature of a non-volatile storage media that stores data in a TLC region and an SLC region, in accordance with some embodiments.

FIG. 1 illustrates a storage device 103 including a sensor 115 to monitor a temperature of a non-volatile storage media 109 that stores data in a TLC region 111 and an SLC region 113, in accordance with some embodiments. In FIG. 1, a host 101 communicates with storage device 103 via a communication channel having a predetermined protocol. The host 101 can be a computer (e.g., mobile phone or other computing device) having one or more central processing units (CPUs) to which computer peripheral devices, such as the storage device 103, may be attached via an interconnect, such as a computer bus.

The computer storage device 103 can be used to store data for the host 101. Examples of computer storage devices in general include solid state drives, flash memory, etc. The storage device 103 has a host interface 105 that implements communications with the host 101 using the communication channel. For example, the communication channel between the host 101 and the storage device 103 is a bus in one embodiment; and the host 101 and the storage device 103 communicate with each other using the eMMC or UFS protocol.

In some implementations, the communication channel between the host 101 and the storage device 103 includes a computer network, such as a local area network, a wireless local area network, a wireless personal area network, a cellular communications network, a broadband high-speed always-connected wireless communication connection (e.g., a current or future generation of mobile network link); and the host 101 and the storage device 103 can be configured to communicate with each other using various data storage management and usage commands.

The storage device 103 has a controller 107 that runs firmware 104 to perform operations responsive to the communications from the host 101. Firmware in general is a type of computer program that provides control, monitoring, and data manipulation of engineered computing devices. In FIG. 1, the firmware 104 controls the operations of the controller 107 in operating the storage device 103, such as translating a logical address to a physical address for storing and accessing data in the storage device 103. In one example, the controller is an internal controller of a managed NAND device that stores data in TLC NAND flash memory.

An example of the non-volatile storage media 109 is memory cells (e.g., SLC, TLC, QLC) in an integrated circuit. The storage media 109 is non-volatile in that no power is required to maintain the data/information stored in the non-volatile storage media 109, which data/information can be retrieved after the non-volatile storage media 109 is powered off and then powered on again. The memory cells may be implemented using various memory types, such as NAND gate based flash memory, phase-change memory (PCM), magnetic memory (MRAM), resistive random-access memory, and 3D XPoint, such that the storage media 109 is non-volatile and can retain data stored therein without power for days, months, and/or years.

In one embodiment, storage device 103 is configured to store data for host 101 in non-volatile storage media 109 using either a first mode or second mode. The first mode has a storage density greater than the second mode. In one example, the first mode is a TLC mode in which data is stored in a TLC flash array of TLC region 111. The second mode is an SLC mode in which data is stored in an SLC flash array of SLC region 113. The mode of operation that is used is controlled by controller 107. In one example, the mode of operation is selected based on sensor data from sensor 115.

In one embodiment, sensor 115 is used to monitor a temperature of non-volatile storage media 109. In one example, sensor 115 is a temperature sensor that is integrated as part of an integrated circuit that includes TLC region 111 and/or SLC region 113.

In one embodiment, during normal operation of storage device 103, controller 107 stores data for host 101 using TLC region 111. Controller 107 monitors one or more temperatures associated with non-volatile storage media 109. In one example, this monitoring includes analyzing sensor data that is received from sensor 115.

Based on data collected from one or more sensors (e.g., sensor 115), controller 107 adjusts a manner of storage of data in non-volatile storage media 109. In one example, controller 107 determines that a temperature of storage media 109 has or will exceed a predetermined temperature threshold. In response to this determination, data stored in TLC region 111 is copied to SLC region 113. The copied data is compressed prior to storing the data in SLC region 113.

In one embodiment, a sensor 117 is mounted externally to storage device 103. In one example, sensor 117 is mounted on an exterior of, but in contact with, the packaging of storage device 103. In another example, sensor 117 is mounted separately from storage device 103 (e.g., sensor 117 and storage device 103 are each mounted in an engine compartment of a vehicle).

In one embodiment, host 101 collects sensor data from sensor 117. Host 101 uses the collected sensor data to determine a temperature associated with storage device 103. In one example, the temperature is an ambient temperature of storage device 103. In one example, the ambient temperature is a temperature of an atmosphere in which storage device 103 is located.

In one embodiment, host 101 uses sensor data collected from sensor 117 and sensor 115 to make a determination regarding the current temperature and/or a projected future temperature of storage device 103 and/or storage media 109. In one example, in response to making a determination regarding the current or future temperature, host 101 activates a cooling or ventilation system 119 that is configured to lower a temperature associated with storage device 103. In one example, cooling system 119 lowers an ambient temperature of storage device 103. In one example, cooling system 119 lowers the temperature of storage media 109 (e.g., by flowing a coolant near and/or through at least a portion of storage device 103).

The storage device 103 includes volatile random-access memory (RAM) 106. In one embodiment, a portion of the RAM is used for the storage of run-time data and instructions used by the controller 107 to improve the computation performance of the controller 107 and/or provide buffers for data transferred between the host 101 and the non-volatile storage media 109. RAM 106 is volatile in that it requires power to maintain the data/information stored therein, which data/information is lost immediately or rapidly when the power is interrupted.

Volatile memory 106 typically has less latency than non-volatile storage media 109, but loses its data quickly when power is removed. Thus, in some cases, it is advantageous to use the volatile memory 106 to temporarily store instructions and/or data used for the controller 107 in its current computing task to improve performance. In some instances, the volatile memory 106 is implemented using volatile static random-access memory (SRAM) that uses less power than DRAM in some applications.

During operation, controller 107 receives various commands from host 101. These commands can include a read command or a write command. In one example, a read command includes a logical address, and is received from host 101 to access stored data in non-volatile storage media 109.

In one example, controller 107 receives a logical address and determines a physical address. The physical address that is determined is used to read that portion of stored data that corresponds to the received logical address. Controller 107 then sends the read data to host 101.

In some instances, the controller 107 has multiple processors, each having its own in-processor cache memory. Optionally, the controller 107 performs data intensive, in-memory processing using data and/or instructions organized in the storage device 103. For example, in response to a request from the host 101, the controller 107 performs a real-time analysis of a set of data stored in the storage device 103 and communicates a reduced data set to the host 101 as a response. For example, in some applications, the storage device 103 is connected to real-time sensors to store sensor inputs (e.g., sensors of an autonomous vehicle or digital camera); and the processors of the controller 107 are configured to perform machine learning and/or pattern recognition based on the sensor inputs to support an artificial intelligence (AI) system that is implemented at least in part via the storage device 103 and/or the host 101.

The storage device 103 can be used in various computing systems, such as a cloud computing system, an edge computing system, a fog computing system, and/or a standalone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

At least some embodiments of the disclosures herein can be implemented using computer instructions executed by the controller 107, such as the firmware 104. In some instances, hardware circuits can be used to implement at least some of the functions of the firmware 104. The firmware 104 can be initially stored in the non-volatile storage media 109, or another non-volatile device, and loaded into the volatile memory 106 and/or the in-processor cache memory for execution by the controller 107.

The firmware 104 can be configured to use the techniques discussed herein that adjust a manner of data storage based on monitoring temperature. However, the techniques discussed herein are not limited to being used in the computer system of FIG. 1 and/or the examples discussed above.

A non-transitory computer storage medium can be used to store instructions of the firmware 104. When the instructions are executed by the controller 107 of the computer storage device 103, the instructions cause the controller 107 or other processing device(s) to perform a method discussed herein.

In one example, the non-volatile storage media 109 of the storage device 103 has memory units that may be identified by a range of LBA addresses, where the range corresponds to a memory capacity of the non-volatile storage media 109.

In one embodiment, a local manager (not shown) of storage device 103 receives data access commands. A data access request (e.g., read, write) from the host 101 identifies an LBA address to read, write, or erase data from a memory unit identified by the LBA address. The local manager translates the logical address to a physical address.

In one embodiment, a controller is implemented by one or more processing devices. In one embodiment, a computer system includes a first memory device (e.g., SRAM) and a second memory device (e.g., a NAND flash storage device), and one or more processing devices (e.g., a CPU or system on a chip (SoC)). In one embodiment, the computer system can include a processing device and a controller.

The processing device can be, for example, a microprocessor, a central processing unit (CPU), a processing core of a processor, an execution unit, etc. In some instances, the controller can be referred to as a memory controller, a memory management unit, and/or an initiator. In one example, the controller controls the communications over a bus coupled between the computer system and one or more memory sub-systems.

The controller of the computer system can communicate with a controller of the memory sub-system to perform operations such as reading data, writing data, or erasing data at memory components and other such operations. In some instances, the controller is integrated within the same package of the processing device. In other instances, the controller is separate from the package of the processing device. The controller and/or the processing device can include hardware such as one or more integrated circuits and/or discrete components, a buffer memory, a cache memory, or a combination thereof. The controller and/or the processing device can be a microcontroller, special purpose logic circuitry (e.g., a field programmable gate array (FPGA), an application specific integrated circuit (ASIC), etc.), or another suitable processor.

In one embodiment, a computing system includes a memory system (e.g., storage device 103) and a host processor (e.g., host 101). In one embodiment, the memory system comprises a managed NAND flash device. In one embodiment, the memory system comprises a solid state drive (SSD).

A host interface (e.g., host interface 105) can be used to transfer data between the memory system and a host processor. The host interface can be in the form of a standardized interface. For example, when the memory system is used for data storage in a computing system, the host interface can be a serial advanced technology attachment (SATA), a serial attached SCSI (SAS), a peripheral component interconnect express (PCIe), or a universal serial bus (USB), among other connectors and interfaces. In general, however, the host interface can provide an interface for passing control, address, data, and other signals between the memory system and a host processor having compatible receptors for the interface. Host processor can be a host system such as a personal laptop computer, a desktop computer, a digital camera, a mobile telephone, or a memory card reader, among various other types of hosts. Host processor can include a system motherboard and/or backplane and can include a number of memory access devices (e.g., a number of processors). In some cases, the host processor can comprise a device configured to pre-program data within the memory system. However, the host processor may additionally comprise a device configured for reading data and writing data to the memory system after manufacturing.

The memory system receives commands and data from the host processor via the host interface which relays the commands and data to the controller. Data from the host comprises uncompressed data to write to the TLC region. This data may be streamed or transferred in bulk.

The controller can communicate with a non-volatile storage media to control data read, write, and erase operations, among other operations described herein. The controller can include, for example, a number of components in the form of hardware and/or firmware (e.g., one or more integrated circuits) and/or software for controlling access to the memory and/or for facilitating data transfer between the host processor and memory system.

In some embodiments, the controller includes a host I/O management component, a flash translation layer (FTL), and a memory unit management component.

In embodiments in which the memory (e.g., non-volatile storage media 109) includes a number of arrays of memory cells, the arrays can be flash arrays with a NAND architecture, for example. However, embodiments are not limited to a particular type of memory array or array architecture. The memory cells can be grouped, for instance, into a number of blocks, which are erased together as a group and can store a number of pages of data per block. A number of blocks can be included in a plane of memory cells and an array can include a number of planes. As used herein, a "page of data" refers to an amount of data that the controller is configured to write/read to/from the non-volatile storage media as part of a single write/read operation and can be referred to as a "flash page". As an example, a memory device may have a page size of 8 KB (kilobytes) and may be configured to store 128 pages of data per block, 2048 blocks per plane, and 16 planes per device.

In some embodiments, as mentioned above, non-volatile storage media 109 comprises two regions: TLC region 111 and SLC region 113. In some embodiments the SLC region is a pseudo-SLC region (pSLC) where TLC memory is configured to function and perform as SLC memory. Notably, the entire non-volatile storage media may be manufactured as TLC flash memory. That is, both regions 111 and 113 may comprise TLC NAND flash memory arrays. In some embodiments, these regions are fixed during manufacturing and addressed via firmware code that is configured to process read/write/erase commands based on the corresponding address in the non-volatile memory. In alternative embodiments, the pSLC region can be dynamically sized and resized. Since the pSLC region is, physically, the same as the TLC region, the resizing (or removing) of the pSLC region can be accomplished via firmware updates that allow utilization of all TLC data states in the pSLC region.

Unlike with traditional hard disk drives, data stored in flash arrays cannot be directly overwritten. That is, a block of flash cells must be erased prior to rewriting data thereto (e.g., a page at a time). In some embodiments, the controller can manage data transferred between the host processor and the flash arrays via a logical-to-physical mapping scheme. For instance, a flash translation layer can employ a logical addressing scheme (e.g., logical block addressing (LBA)). As an example, when new data received from the host processor is to replace older data already written to the flash array, the controller can write the new data in a new location on the non-volatile storage media and the logical-to-physical mapping of the FTL can be updated such that the corresponding logical address(es) associated with the new data being written indicates (e.g., points to) the new physical location. The old location, which no longer stores valid data, will be erased prior to being written again.

Flash memory cells can be cycled (e.g., programmed/ erased) a limited number of times before they become unreliable. The controller can implement wear leveling to control the wear rate on the non-volatile storage media, which can reduce the number of program/erase cycles performed on a particular group (e.g., block) by spreading the cycles more evenly over the entire array. Wear leveling can include a technique called garbage collection, which can include reclaiming (e.g., erasing and making available for writing), blocks that have the greatest number of invalid pages. An invalid page can refer to a page containing invalid data (e.g., a page that no longer has an up-to-date mapping associated therewith). Alternatively, garbage collection can include reclaiming blocks with more than a threshold amount of invalid pages. If sufficient free blocks exist for a writing operation, then a garbage collection operation may not occur.

Write amplification may occur when writing data to non-volatile storage media. When randomly writing data to a memory array, the controller scans for available space in the array. Available space in a memory array can be individual cells, pages, and/or blocks of memory cells that are not storing data and/or have been erased. If there is enough available space to write the data in a selected location, then the data is written to the selected location of the memory array. If there is not enough available space in the selected location, the data in the memory array is rearranged by reading, copying, moving, or otherwise rewriting and erasing the data that is already present in the selected location to a new location, leaving available space for the new data that is to be written in the selected location. The relocation of valid data in the memory array is referred to as write amplification because the amount of data written to memory is greater than the amount of data that would occur if there were sufficient available space in the selected location (e.g., the physical amount of data is greater than the logical amount intended to be written). Write amplification is undesirable since it can consume bandwidth, which reduces performance, and can reduce the useful lifetime of an SSD. The amount of write amplification can be effected by various factors such as garbage collection efficiency, wear leveling efficiency, amount of random writes (e.g., writes to non-sequential logical addresses), and/or over-provisioning (e.g., the difference between the physical capacity of flash memory and the logical capacity presented through the operating system as available to the user), among other factors.

The flash translation layer can, in collaboration with a host I/O management component (not shown) and a mapping unit management component (not shown), perform address mapping. In some embodiments, the host I/O management component manages data received in association with write commands from the host processor (e.g., prior to mapping via the FTL). The I/O workload of the host processor can be irregular and/or variable. For instance, large file writes (e.g., writes corresponding to a large amount of data) can often be mixed with small writes (e.g., writes corresponding to a small amount of data). In this context, "large" and "small" refer only to a relative difference in size. As an example, a small write may refer to writing of 4 KB of metadata. A large file write may include writing of 128 KB of data, for instance. A large file write may comprise a number of consecutive large file writes. For instance, writing of a 2 GB video file may comprise a number of consecutive 128 KB write commands from the host processor.

In one embodiment, a controller (e.g., controller 107) includes firmware, which controls the operation of the memory system as described above. Additionally, the firmware implements a codec that performs the compression and decompression routines described above. In one example, this compressed data is stored in the SLC mode in SLC region 113. The controller is further modified to monitor one or more temperatures. In response to detecting a high temperature from this monitoring, the controller compresses the data from the TLC region (e.g., TLC region 111). The compressed data is then written to the SLC region (e.g., SLC region 113).

Figure 2:
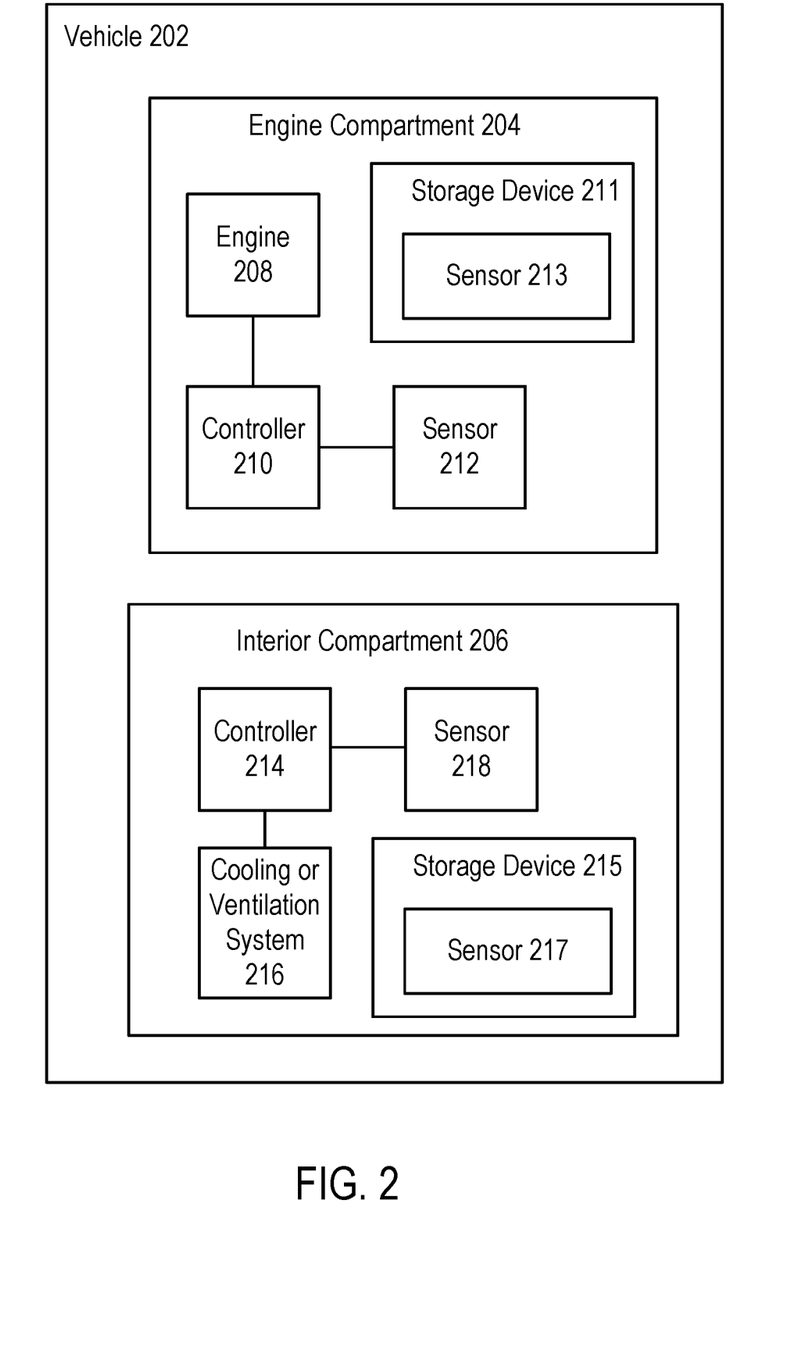
FIG. 2 illustrates a vehicle including a storage device mounted in an engine compartment of the vehicle, and a storage device mounted in an interior compartment of the vehicle, in accordance with some embodiments.

FIG. 2 illustrates a vehicle 202 including a storage device 211 mounted in an engine compartment 204 of the vehicle 202, and a storage device 215 mounted in an interior compartment 206 of vehicle 202, in accordance with some embodiments. Storage device 211 and storage device 215 are examples of storage device 103 of FIG.

In one example, vehicle 202 is powered by a gasoline-fueled engine 208. In alternative embodiments, vehicle 202 can be an electric-powered vehicle that is powered using a storage battery (not shown) of vehicle 202.

A controller 210 is mounted in engine compartment 204. Controller 210 controls the operation of an engine 208 that is mounted in engine compartment 204. Controller 210 receives sensor data collected by a sensor 212 mounted in engine compartment 204. Sensor 212 is an example of sensor 117 of FIG. 1. In one example, engine 208, controller 210, and sensor 212 are mounted underneath a front or rear hood of vehicle 202.

In one embodiment, sensor 212 detects an ambient temperature within the engine compartment 204. In one example, sensor 212 detects a temperature of a surface of storage device 211. In one example, the surface is an external surface of packaging or another physical enclosure of storage device 211. In one example, sensor 212 is included in an integrated circuit or chip mounted on a circuit board along with the storage device 211.

In one embodiment, during operation, controller 210 controls the manner of storage of data in storage device 211 based on sensor data received from sensor 212. In one embodiment, controller 210 further controls the operation of engine 208 based on the sensor data received from sensor 212.

A sensor 213 of storage device 211 collects sensor data regarding a temperature associated with storage device 211. Sensor 213 is an example of sensor 115 of FIG. 1.

In one embodiment, controller 210 controls a manner of storage in storage device 211 based on sensor data received from sensor 212 and/or sensor 213. In one embodiment, a controller (not shown) of storage device 211 controls the manner of storage of data in storage device 211 based on temperature data collected by sensor 213.

In one embodiment, storage device 211 controls the manner of storage independently from controller 210. In one example, storage device 211 sends a signal to controller 210 indicating a change has been made and/or will be made in the manner of storage of data in storage device 211. In one embodiment, in response to receiving the signal, controller 210 changes a configuration of sensor 212 regarding a type or manner of data to be collected by sensor 212. In one embodiment, controller 210 changes a mode of operation of engine 208 from a normal mode to a conservative mode (e.g., a mode that requires less intensive data processing bandwidth, lower power, and/or data processing resources) in response to determining that a change has been made in the manner of storage of data in storage device 211.

A controller 214 and sensor 218 are each mounted in interior compartment 206. Controller 214 receives sensor data collected by sensor 218. In one example, the sensor data is temperature data. In one example, the temperature data is for an ambient temperature of interior compartment 206.

Storage device 215 is controlled, at least in part, based on signals received from controller 214. In one embodiment, controller 214 causes a change in a manner of storage of data in storage device 215 based on temperature data collected from sensor 218. In one embodiment, controller 214 changes the operation of cooling or ventilation system 216 in order to lower an operating temperature of storage device 215. In one example, cooling or ventilation system 216 provides cooled air and/or an airflow to interior compartment 206. In one example, storage device 215 and sensor 218 are mounted under the dash of a vehicle.

In one embodiment, storage device 215 includes a sensor 217. Sensor 217 collects temperature data associated with storage device 215. In one example, sensor 217 collects data indicating a temperature of a non-volatile storage media of storage device 215.

In one embodiment, controllers 210 and 214 share sensor data that has been collected. In one example, controller 214 adjusts a manner of storage of data in storage device 215 based at least in part on sensor data collected by sensor 212 and/or sensor 213.

Figure 3:
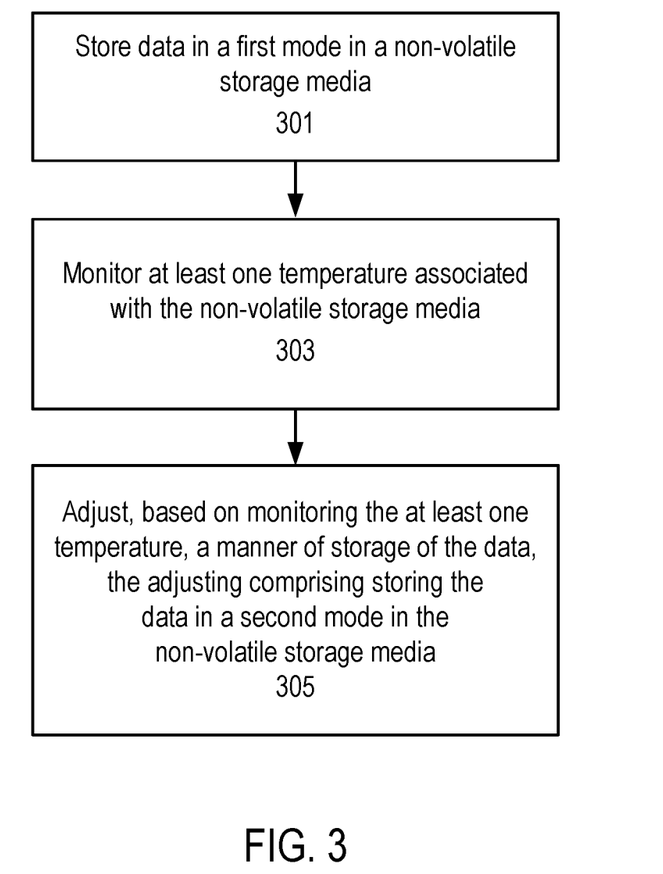
FIG. 3 shows a method for adjusting a manner of storage of data based on monitoring one or more temperatures, in accordance with some embodiments.

FIG. 3 shows a method for adjusting a manner of storage of data based on monitoring one or more temperatures, in accordance with some embodiments. For example, the method of FIG. 3 can be implemented in the system of FIG. 1. In one example, the manner of storage of data in storage device 103 of FIG. 1 is adjusted.

The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed at least in part by one or more processing devices (e.g., controller 107 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 301, data is stored in a first mode in a non-volatile storage media. In one example, data is stored by controller 107 in non-volatile storage media 109.

At block 303, one or more temperatures associated with the non-volatile storage media are monitored. In one example, a temperature of non-volatile storage media 109 is determined using sensor 115. In one example, an ambient temperature of storage device 103 is determined using sensor 117.

At block 305, based on monitoring the one or more temperatures, a manner of storage of the data is adjusted. The adjusting comprises storing the data in a second mode in the non-volatile storage media. In one example, data stored in TLC region 111 is compressed and copied to SLC region 113.

In one embodiment, a method for a storage device (e.g., storage device 103) comprises: storing, by the storage device, first data in a first mode (e.g., a TLC mode) in a non-volatile storage media (e.g., non-volatile storage media 109); monitoring at least one temperature associated with the non-volatile storage media; and adjusting, based on monitoring the at least one temperature, a manner of storage of the first data. The adjusting comprises: compressing the first data to provide compressed data, and storing the compressed data in a second mode (e.g., an SLC mode) in the non-volatile storage media, wherein the first mode has a storage density greater than the second mode.

In one embodiment, the monitoring comprises collecting sensor data from at least one sensor (e.g., sensor 115 and/or sensor 117).

In one embodiment, the at least one sensor comprises a first sensor located in the storage device (e.g., sensor 115) to detect a first temperature of the non-volatile storage media, and a second sensor (e.g., sensor 117, sensor 212, and/or sensor 218) mounted externally to the storage device, the second sensor configured to detect a second temperature of an atmosphere (e.g., ambient air surrounding the storage device) external to the storage device.

In one embodiment, the storage device and the second sensor are each mounted inside a compartment of a vehicle, and the compartment comprises a motor that provides power to one or more axles of the vehicle. In one example, the motor is an internal combustion engine. In one example, the motor is an electric motor. In one example, there may be multiple motor compartments or locations on the vehicle. In one example, the storage device and the second sensor are each mounted inside an engine compartment of a vehicle (e.g., vehicle 202), and the compartment includes an engine that provides power to the vehicle.

In one embodiment, the method further comprises: determining that a first temperature of the non-volatile storage media is less than a predetermined threshold (e.g., a predetermined temperature that corresponds to an increased risk of data loss due to high-temperature); in response to determining that the first temperature is less than the predetermined threshold, decompressing the stored compressed data to provide decompressed data; and storing the decompressed data in the first mode in the non-volatile storage media.

In one embodiment, monitoring the at least one temperature comprises determining that a first temperature of the non-volatile storage media is greater than a predetermined threshold. The method further comprises: in response to determining that the first temperature is greater than the predetermined threshold, adjusting operation of a cooling or ventilation system (e.g., cooling or ventilation system 119) of a vehicle to lower an ambient temperature of the storage device.

In one embodiment, monitoring the at least one temperature comprises determining, based on collected sensor data, that a first temperature of the non-volatile storage media is greater than a predetermined threshold; compressing the first data includes copying the first data from a first region of the non-volatile storage media, the first region operating in the first mode; and the compressed data is stored in a second region of the non-volatile storage media, the second region operating in the second mode.

In one embodiment, monitoring the at least one temperature comprises: predicting a future temperature; and determining that the future temperature will exceed a predetermined threshold.

In one embodiment, the future temperature is a temperature of the storage device, or an ambient temperature of the storage device.

In one embodiment, the method further comprises: for each of a plurality of data portions stored in the non-volatile storage media, storing a respective data type corresponding to the stored data portion; and determining, based on the stored data types, a first data type corresponding to the first data. Adjusting the manner of storage is further based on the determined first data type. In one example, a first data type corresponds to data used to navigate vehicle 202. In one example, another data type includes data that is less critical to real-time operation, such as data that is not used to navigate a vehicle.

In one embodiment, the storage device stores data used in operating a vehicle, and monitoring the at least one temperature is performed by at least one of the storage device, or a controller (e.g., controller 210 or controller 214) of a computing system of the vehicle.

In one embodiment, the first mode is a multi-level cell (MLC) mode, a triple-level cell (TLC) mode, or a quad-level cell (QLC) mode, and wherein the second mode is a single-level cell (SLC) mode.

In one embodiment, a non-transitory computer storage medium stores instructions which, when executed on a computing device, cause the computing device to at least: store first data in a first mode in a non-volatile storage media; monitor at least one temperature associated with the non-volatile storage media; and adjust, based on monitoring the at least one temperature, a manner of storage of the first data, the adjusting comprising storing the first data in a second mode in the non-volatile storage media.

In one embodiment, the first mode has a storage density greater than the second mode.

In one embodiment, the instructions further cause the computing device to compress the first data to provide compressed data. Storing the first data in the second mode comprises storing the compressed data.

In one embodiment, a system comprises: a storage device configured to store data in a non-volatile storage media using either a first mode or a second mode, wherein the first mode has a storage density greater than the second mode; at least one sensor; at least one processing device; and memory containing instructions configured to instruct the at least one processing device to: store first data in the first mode in the non-volatile storage media; monitor, using the at least one sensor to collect sensor data, at least one temperature associated with the non-volatile storage media; and adjust, based on the collected sensor data, a manner of storage of the first data. The adjusting comprises compressing the first data to provide compressed data, and storing the compressed data in the second mode in the non-volatile storage media.

In one embodiment, the non-volatile storage media comprises a first region (e.g., TLC region 111) and a second region (e.g., SLC region 113), the first region operating in the first mode (e.g., TLC mode), and the second region operating in the second mode (e.g., SLC mode).

In one embodiment, the at least one sensor comprises a first sensor located in the storage device to detect a temperature of the non-volatile storage media.

In one embodiment, the at least one sensor comprises a first sensor mounted externally to the storage device, the first sensor configured to detect a temperature of an atmosphere external to the storage device.

In one embodiment, the system further comprises a cooling or ventilation system of a vehicle. Monitoring the at least one temperature comprises determining that a first temperature of the non-volatile storage media is greater than a predetermined threshold. The instructions are further configured to instruct the at least one processing device to, in response to determining that the first temperature is greater than the predetermined threshold, adjust operation of the cooling or ventilation system to lower an ambient temperature of the storage device.

In one example, a method stores data into a TLC region of a NAND flash array. The method monitors at least one temperature associated with the non-volatile storage media that includes the TLC region and a pSLC region. The method writes TLC data to the pSLC region of the NAND flash array based on monitoring the at least one temperature.

In one embodiment, the method may designate part of the TLC region to operate as pSLC NAND flash memory. Since pSLC utilizes the underlying TLC architecture, the method may modify the firmware to enable pSLC access to the pSLC region. This effectively converts part of the TLC region into a pSLC region. In some embodiments, the method may copy part or all of the TLC data into cache memory prior to designating part of the TLC region to operate as pSLC NAND flash memory.

In one embodiment, a set of addresses of a NAND flash array may be designated as a pSLC region. For example, the first N addresses of the array may be designated as the pSLC region. Designating a pSLC region comprises configuring firmware to only write one bit per cell in the pSLC region. In one embodiment, the method accesses the pSLC region simply by writing to the addresses. In other embodiments, a NAND array controller provides commands for accessing the pSLC region. In one embodiment, the method sequentially writes compressed data to the pSLC region (e.g., starting at address zero).

In some embodiments, data in a TLC region is compressed prior to being written into a pSLC region. In one embodiment, this algorithm is executed by a codec represented in the memory device's firmware/controller. Alternatively, the codec can be situated external to the device.

In one embodiment, the stored data is compressed using a lossless compression algorithm. In one example, data from TLC region 111 is compressed prior to being written to pSLC region 113. In one embodiment, this compression may be performed by a controller of the memory device itself (received via a host interface, JTAG, etc.). Various lossless compression algorithms may be used such as run-length encodings (RLE), bzip2, Lempel-Ziv compression (and variants thereof), etc. Alternatively, or in conjunction with the foregoing, application-specific compression algorithms may be used based on the data to be written. For example, Free Lossless Audio Codec (FLAC) may be used for audio data or H.264 lossless compression may be used for video data. The specific type of lossless compression algorithm used is not limiting.

In some embodiments, prior to writing, the method confirms whether the size of the compressed data will fit within the pSLC region. If so, the method continues to write the complete compressed data into the pSLC region. If not, the method may selectively compress a portion of the data in the TLC region and write the compressed data to the pSLC region of the NAND flash array. In some embodiments, the method may segment uncompressed data into bits and pad each bit with two zeros to simulate pSLC operations in the TLC operation. In some embodiments, the method may distribute data in the pSLC region such that data is not written to consecutive cells.

In one embodiment, a method may copy the contents of the TLC region to cache memory such as onboard dynamic random-access memory (DRAM) or static random-access memory (SRAM) that is installed as part of the memory device (e.g., in an SSD or similar device). In some embodiments, the method copies the entire contents of the TLC region to cache memory for processing. In other embodiments, the method may stream data from the TLC region for processing, reducing SRAM/DRAM usage. In some embodiments, the SRAM/DRAM will be sized to accommodate the TLC region and thus the entire contents of the TLC can be copied to the cache.

In some embodiments, the method may write the compressed data starting at the first pSLC address. The method may write the data sequentially as it is encoded from the start of the pSLC region. In other embodiments, the compressed data may include indications of addresses in which the data should be written into the pSLC region.

In an alternative embodiment, the method may compress the TLC data and store the data within the cache until all TLC data is compressed. The method may then perform a bulk write of the compressed data to the pSLC region.

In some embodiments, the method checks to determine if all the data in the TLC region has been compressed and copied to the pSLC region. If not, the method continues to compress any remaining data in the TLC region and write the data to the pSLC region.

In some embodiments, the method performs error code correction (ECC) on the compressed data. In some embodiments, the method may perform ECC prior to compressing as well. Embodiments are not limited on the specific type of ECC employed and, in some embodiments, the method may utilize the ECC installed within the memory device and used during normal operations.

In one embodiment, the method updates the controller firmware to enable pSLC operation of the pSLC region.

In some embodiments, the pSLC region is retained throughout the life of the device. In these embodiments, the compressed data may be retained in the pSLC region.

In some embodiments, the method enables access to the TLC and pSLC regions for a host processor. In some embodiments, the method may deny access to the flash array while data is being compressed and written to the pSLC region. After completion of the process, the method may enable read/write/erase and other operations on the NAND flash array in accordance with standard interfaces.

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
   a non-volatile storage media configured to store data using either a first mode or a second mode, wherein the first mode has a storage density greater than the second mode;
   at least one sensor; and
   a controller configured to:
   store first data in the first mode in the non-volatile storage media;
   receive sensor data from the sensor;
   monitor, using the received sensor data, at least one temperature associated with the non-volatile storage media, wherein monitoring the at least one temperature comprises predicting a future temperature, and determining that the future temperature will exceed a predetermined threshold; and
   adjust, based on monitoring the temperature, a manner of storage of the first data, the adjusting comprising storing the first data in the second mode in the non-volatile storage media.

2. The apparatus of claim 1, wherein the non-volatile storage media is configured in a storage device, and wherein the at least one sensor comprises a first sensor located in the storage device to detect a first temperature, and a second sensor mounted externally to the storage device, the second sensor configured to detect a second temperature of an atmosphere external to the storage device.

3. The apparatus of claim 2, wherein the storage device and the second sensor are each mounted inside a compartment of a vehicle, and wherein the compartment comprises a motor that provides power to one or more axles of the vehicle.

4. The apparatus of claim 1, wherein the non-volatile storage media and the sensor are configured in a storage device, and wherein the future temperature is a temperature of the storage device, or an ambient temperature of the storage device.

5. The apparatus of claim 1, further comprising a cooling or ventilation system, wherein:
   the non-volatile storage media is configured in a storage device;
   monitoring the at least one temperature comprises determining that a first temperature of the non-volatile storage media is greater than a predetermined threshold; and
   the controller is further configured to, in response to determining that the first temperature is greater than the predetermined threshold, adjust operation of the cooling or ventilation system to lower an ambient temperature of the storage device.

6. The apparatus of claim 1, wherein the controller is further configured to activate a cooling system in response to the controller determining that the future temperature will exceed the predetermined threshold.

7. The apparatus of claim 1, wherein the sensor is a temperature sensor coupled to send the sensor data to the controller, and wherein the controller is further configured to determine a current temperature using the sensor data.

8. The apparatus of claim 1, wherein the controller is further configured to use an output from a machine learning model to predict the future temperature.

9. The apparatus of claim 8, wherein the received sensor data is an input to the machine learning model.

10. The apparatus of claim 1, wherein the sensor is located in a storage device that includes the non-volatile storage media.

11. The apparatus of claim 1, wherein the sensor is located externally to a storage device that includes the non-volatile storage media.

12. An apparatus comprising:
    a non-volatile storage media configured to store data using either a first mode or a second mode, wherein the first mode has a storage density greater than the second mode; and
    a controller configured to:
    store first data in the first mode in the non-volatile storage media;
    predict a future temperature associated with the non-volatile storage media; and
    adjust, based on the predicted future temperature, a manner of storage of the first data, the adjusting comprising storing the first data in the second mode in the non-volatile storage media.

13. The apparatus of claim 12, wherein the controller is further configured to:
   after storing the first data in the second mode, determine that a first temperature associated with the non-volatile storage media is less than a predetermined threshold; and
   in response to determining that the first temperature is less than the predetermined threshold, store the first data in the first mode in the non-volatile storage media.

14. The apparatus of claim 12, wherein the controller is further configured to:
   compress the first data to provide compressed data;
   wherein storing the first data in the second mode comprises storing the compressed data.

15. The apparatus of claim 12, wherein the first mode is a multi-level cell (MLC) mode, a triple-level cell (TLC) mode, or a quad-level cell (QLC) mode, and wherein the second mode is a single-level cell (SLC) mode.

16. The apparatus of claim 12, wherein the controller is further configured to:
   determine that a first temperature of the non-volatile storage media is greater than a predetermined threshold; and
   in response to determining that the first temperature is greater than the predetermined threshold, adjust operation of a cooling or ventilation system to lower a temperature of the non-volatile storage media.

17. The apparatus of claim 12, wherein the controller is further configured to:
   compress the first data, the compressing including copying the first data from a first region of the non-volatile storage media, the first region operating in the first mode; and
   store the compressed data in a second region of the non-volatile storage media, the second region operating in the second mode.

18. The apparatus of claim 12, further comprising a sensor, wherein the controller is further configured to use an output from a machine learning model to predict the future temperature based on data from the sensor.

19. The apparatus of claim 12, wherein the controller is further configured to:
   for each of a plurality of data portions stored in the non-volatile storage media, store a respective data type corresponding to the stored data portion; and
   determine, based on the stored data types, a first data type corresponding to the first data;
   wherein adjusting the manner of storage of the first data is based on the determined first data type.

20. A method comprising:
   storing first data in a first mode in a non-volatile storage media;
   receiving sensor data from at least one sensor;
   monitoring, using the received sensor data, at least one temperature associated with the non-volatile storage media, wherein monitoring the at least one temperature comprises predicting a future temperature, and determining that the future temperature will exceed a predetermined threshold; and
   adjusting, based on monitoring the temperature, a manner of storage of the first data, the adjusting comprising storing the first data in a second mode in the non-volatile storage media.

* * * * *